United States Patent
Wakimoto

(10) Patent No.: US 7,329,881 B2
(45) Date of Patent: Feb. 12, 2008

(54) CHARGED-PARTICLE BEAM SYSTEM

(75) Inventor: Osamu Wakimoto, Tokyo (JP)

(73) Assignee: JEOL Ltd., Tokyo (JP)

( * ) Notice: Subject to any disclaimer, the term of this patent is extended or adjusted under 35 U.S.C. 154(b) by 252 days.

(21) Appl. No.: 11/088,225

(22) Filed: Mar. 23, 2005

(65) Prior Publication Data
US 2005/0211681 A1 Sep. 29, 2005

(30) Foreign Application Priority Data
Mar. 23, 2004 (JP) .............................. 2004-083763

(51) Int. Cl.
*H01J 37/304* (2006.01)
(52) U.S. Cl. ............................. 250/491.1; 250/492.22; 250/310; 219/121.68; 700/193
(58) Field of Classification Search ............. 250/491.1
See application file for complete search history.

(56) References Cited

U.S. PATENT DOCUMENTS

| 4,063,103 | A | | 12/1977 | Sumi |
|---|---|---|---|---|
| 4,291,231 | A | | 9/1981 | Kawashima et al. |
| 5,892,237 | A | * | 4/1999 | Kawakami et al. .... 250/492.22 |
| 6,538,248 | B1 | * | 3/2003 | Kametani et al. ........... 250/310 |

* cited by examiner

*Primary Examiner*—Robert Kim
*Assistant Examiner*—Phillip A. Johnston
(74) *Attorney, Agent, or Firm*—The Webb Law Firm

(57) ABSTRACT

A charged-particle beam system used to fabricate or inspect semiconductor devices comprises the charged-particle beam accurately brought into position on a workpiece. The system has a workpiece stage, a laser metrology system for measuring movement of the stage, a first calculation unit for calculating the difference between the amount of movement of the stage measured and a target amount of movement of the stage. The amount of movement of the stage produced between the instant when the difference is calculated and the instant when the beam deflection system is started is calculated. Signals indicative of the calculated amounts are supplied to the deflection system.

2 Claims, 6 Drawing Sheets

CHARGED-PARTICLE BEAM SYSTEM

BACKGROUND OF THE INVENTION

1. Field of the Invention

The present invention relates to a charged-particle beam system equipped with metrology equipment using a laser interferometer.

2. Description of Related Art

A charged-particle beam lithographic system, such as an electron beam lithographic system, is available as a machine for creating semiconductor devices. Also, a charged-particle beam inspection system, such as an electron beam inspection system, is available as a machine for inspecting created semiconductor devices.

In such a system associated with fabrication of semiconductor devices, a workpiece from which semiconductor devices are lithographically fabricated or a workpiece on which semiconductor devices have been fabricated and which is to be inspected is placed on a workpiece stage. Under this condition, lithography or inspection is performed.

FIG. 1 schematically shows one example of an electron beam lithographic system. This system has an electron gun 1 emitting an electron beam. A condenser lens 2 focuses the beam onto a workpiece 4 on which a pattern is to be delineated, the workpiece 4 being placed on a workpiece stage 3. X- and Y-direction deflectors 5X and 5Y direct the beam at a position on the workpiece 4 according to positional data about a delineated pattern.

The workpiece stage 3 comprises an X-stage 3X for movement in the X-direction, a Y-stage 3Y for movement in the Y-direction, and a workpiece-holding stage 3H for holding the workpiece 4. The X- and Y-stages 3X and 3Y are driven by an X-stage drive mechanism 6X and a Y-stage drive mechanism 6Y, respectively.

Also shown in FIG. 1 are a reflective mirror 7, a laser head 8 for emitting laser light, an interferometer 9, and a metrology control circuit 10. A semitransparent mirror is positioned inside the interferometer 9 and splits the laser light from the laser head 8 into two beams traveling in different optical paths. One beam is made to impinge on the reflective mirror 7 mounted to the workpiece-holding stage 3H. The other beam is made to hit a reference reflective mirror disposed inside. The beams reflected from both reflective mirrors create interference fringes on the surface of the semitransparent mirror. The interferometer 9 produces a pulsed signal corresponding to each bright or dark portion of the interference fringes to the metrology control circuit 10 whenever the stage 3 moves a distance equal to the half wavelength.

A controller 11 sends a deflection signal corresponding to the positional data about the delineated pattern to the deflectors 5X and 5Y via D/A converters 12X, 12Y and via amplifiers 13X, 13Y. Also, the controller sends a stage-moving signal to the stage drive mechanisms 6X and 6Y via D/A converters 14X and 14Y. Furthermore, the controller sends a signal indicating a target position of the stage to the metrology control circuit 10.

A blanking mechanism 15 is composed of a blanking deflector 15D and a blanking plate 15P, and blanks the electron beam from the electron gun 1 in response to a blanking signal based on data about a pattern delineation time, the signal being sent in from the controller 11.

Also shown are D/A converters 16X, 16Y and amplifiers 17X, 17Y.

When a semiconductor pattern is delineated in practice, the electron beam from the electron gun 1 is focused onto the workpiece 4 by the action of the condenser lens 2. At the same time, the deflection signal based on the pattern data from the controller 11 is sent to the deflectors 5X and 5Y, so that the beam scans a desired area on the workpiece 4. Because of this scanning, a desired pattern is written on the workpiece.

In this processing for delineating a pattern, when the beam shifts from one field to the next on the workpiece, the controller 11 sends a stage movement signal to at least one of the stage drive mechanisms 6X and 6Y via the D/A converters 14X, 14Y to make a movement corresponding to one field. As a result, at least one of the X-stage 3X and Y-stage 3Y moves a distance corresponding to one field. The stage position taken after the movement is measured. The error between the measured position and the target position is corrected. The measurement and correction are described in further detail below.

In FIG. 1, the shown reflective mirror 7 and interferometer 9 are with respect to only one direction. In practice, an L-shaped reflective mirror 7L having two reflective side surfaces perpendicular to the directions of movements, or X- and Y-directions, are mounted on the workpiece-holding stage 3H as shown in FIG. 2. Laser light produced from the laser head 8 is split into two beams for measurements on the X- and Y-axes by a laser splitter 24. The direction of one beam is bent by a laser bender 25 for X-axis measurement, and the beam is made to impinge perpendicularly on one reflective surface of the L-shaped reflective mirror 7L via an X-direction interferometer 9X. The other beam is bent in direction by a laser bender 26 for Y-axis measurement and made to impinge perpendicularly on the other reflective surface of the L-shaped reflective mirror 7L via a Y-direction interferometer 9Y. Because of this structure, pulsed signals corresponding to amounts of movement of the X-stage 3X and Y-stage 3Y are sent to the metrology control circuit 10 by the interferometers 9X and 9Y, respectively.

Since signals ($X_0$, $Y_0$) indicative of the target position of the stage are sent to the metrology control circuit 10 from the controller 11, the circuit sends the errors (errors in stage stop position) between the signals from the interferometers 9X and 9Y and the target position signals ($X_0$, $Y_0$) to the amplifiers 13X and 13Y via the D/A converters 16X, 16Y and amplifiers 17X, 17Y. The amplifiers 13X and 13Y are connected to the deflectors 5X and 5Y. Accordingly, signals corresponding to the errors in the stage stop position are added to the deflection signals based on the pattern data. The resulting signals are supplied to the deflectors 5X and 5Y. Consequently, the errors in the stage stop position are corrected by deflection of the electron beam.

See, for example, U.S. Pat. No. 4,063,103.

When one field has been written and then the next field is to be written, the stage 3 is moved a distance corresponding to one field as described previously. Movement of the stage and deflection using the deflectors are made in the X- and Y-directions. For convenience of illustration, they will be described in relation to only one direction; description regarding the other direction is omitted.

Referring also to FIG. 3, it is now assumed that the stage is in a position Xa and that delineation of the field A is terminated at instant of time Ta. When the stage is in a position Xb, a field B will be written next.

When a movement signal corresponding to the position Xb is fed to the X-movement stage drive mechanism 6 from the controller 11, the stage 3 is started to be moved as shown in FIG. 3. The stage decelerates as it approaches the position Xb. At an instant of time Tb, the stage is almost at rest. In practice, however, the stage oscillates to and fro about the position Xb. This oscillation attenuates gradually. When the amplitude of the oscillation enters a tolerable range Vo at instant of time Tc, the field B is started to be delineated lithographically.

In delineating the field B, error (Vo/2) in the stage stop position is corrected by deflection of the electron beam. However, the following problem is produced at this time.

It takes some time (hereinafter referred to as the correction delay time) for the metrology control circuit 10 until a correction is made using the X-direction deflector 5X after the control circuit 10 measures the error (Vo/2) in the stage stop position based on the stage position signal from the interferometer 9 and on the stage target position signal from the controller 11. Therefore, movement of the stage made during the correction delay time is not corrected. Correspondingly, the electron beam is made to hit a position deviated from the desired position.

The correction delay time adversely affects the accuracy at which the pattern is lithographically delineated. Since semiconductor devices have been fabricated at quite high densities in recent years, the effect is quite great.

For example, the oscillation of the stage within the tolerable range Vo is regarded as a sinusoidal wave having a period of 100 Hz and an amplitude of ±1 μm. In this case, the correction delay time is 10 μsec. During this time interval, the stage moves about 6.28 nm. Accordingly, if a correction corresponding to error (Vo/2) in the stage stop position is made, positional error of about 6 nm is produced in the irradiation position. This error directly deteriorates the accuracy at which the pattern is lithographically written.

SUMMARY OF THE INVENTION

It is an object of the present invention to provide a novel charged-particle beam system free of the foregoing problem.

A charged-particle beam system, according to the present invention, has a workpiece stage carrying thereon a workpiece to be irradiated with a charged-particle beam, a laser metrology system for measuring the amount of movement of the stage, and first calculation means for calculating the difference, or error, between the amount of movement of the stage measured by the laser metrology system and a target amount of movement of the stage. A signal corresponding to the amount calculated by the first calculation means is supplied to a beam deflection system. There is provided second calculation means for calculating the amount of movement of the stage made between the instant at which the difference is calculated and the instant at which the beam deflection system is started to be operated in response to a signal corresponding to the error. A signal corresponding to the calculated amount of movement is supplied to the beam deflection system.

According to the charged-particle beam system of the present invention, error in the stage stop position and amount of movement of the stage due to the correction delay time are corrected. As a result, the electron beam is made to correctly hit a desired position on the workpiece placed on the workpiece stage.

Other objects and features of the present invention will appear in the course of the description thereof, which follows.

DESCRIPTION OF THE PREFERRED EMBODIMENTS

An embodiment of the present invention is hereinafter described in detail with reference to the accompanying drawings.

Figure 4:
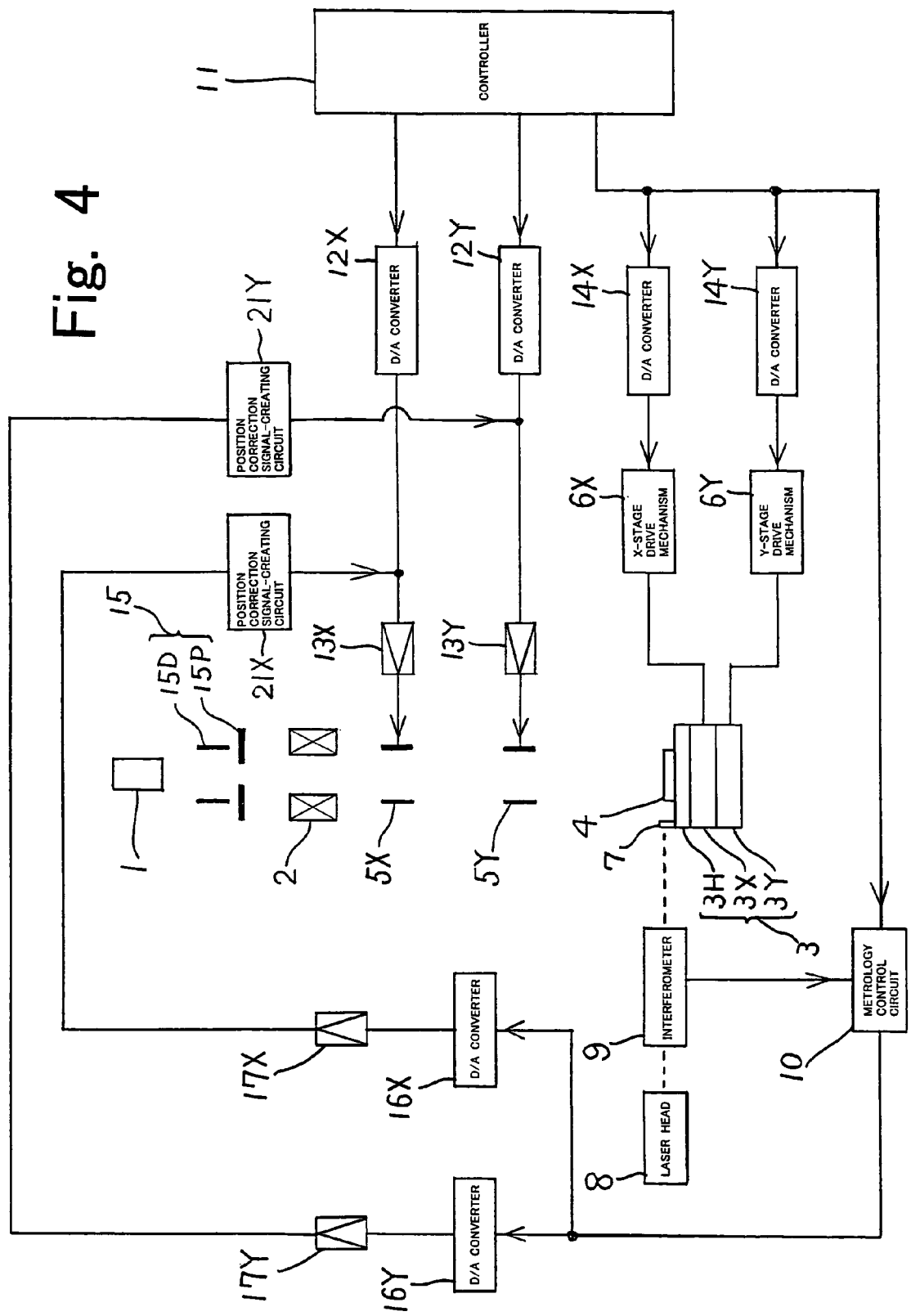
FIG. 4 is a schematic block diagram of an electron beam lithographic system that is one example of the charged-particle beam system of the present invention.

FIG. 4 schematically shows an electron beam lithographic system that is one example of the charged-particle beam system of the present invention. Like components are indicated by like reference numerals in various figures including FIG. 1.

Figure 1:
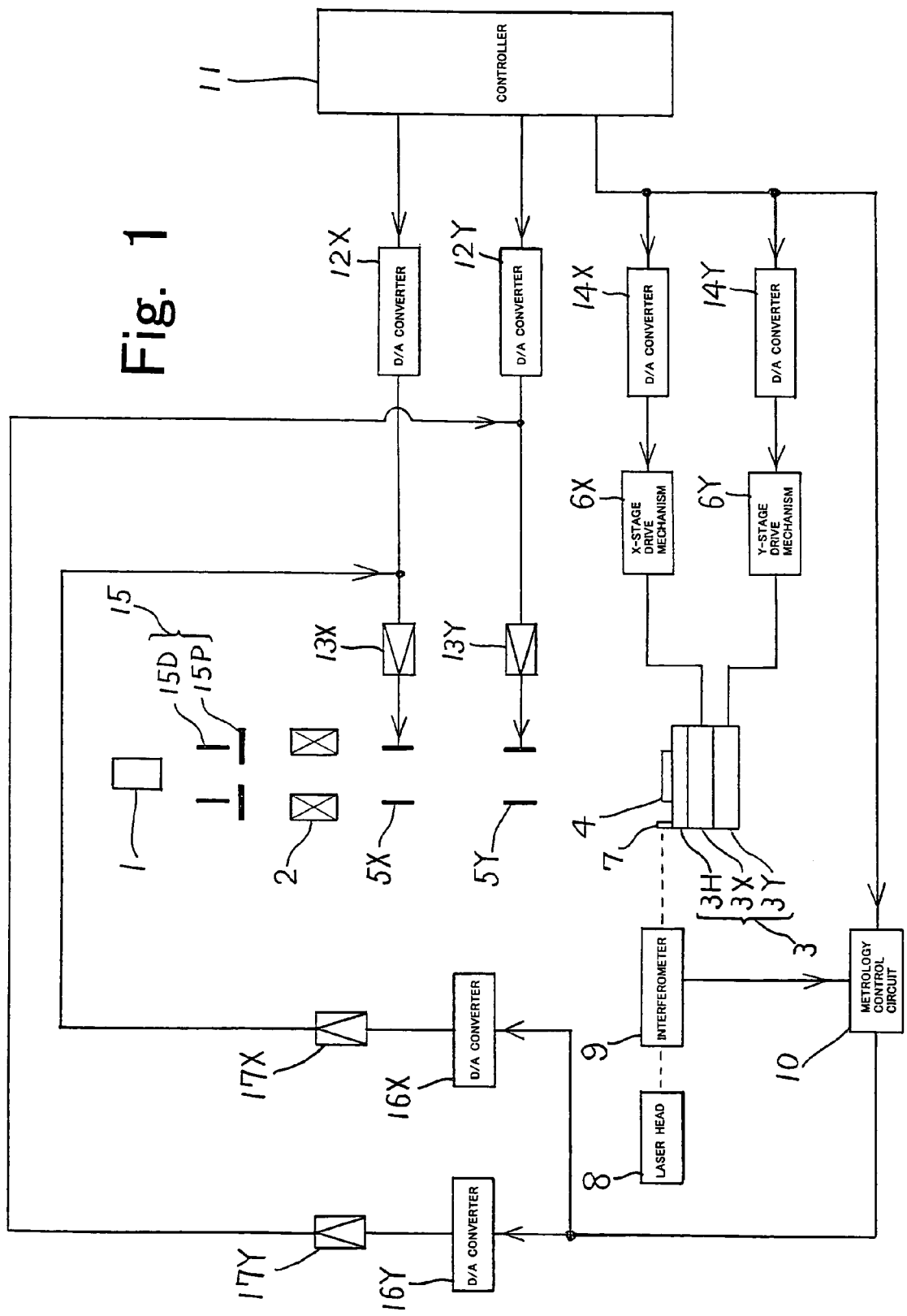
FIG. 1 is a schematic block diagram of an electron beam lithographic system.
Figure 2:
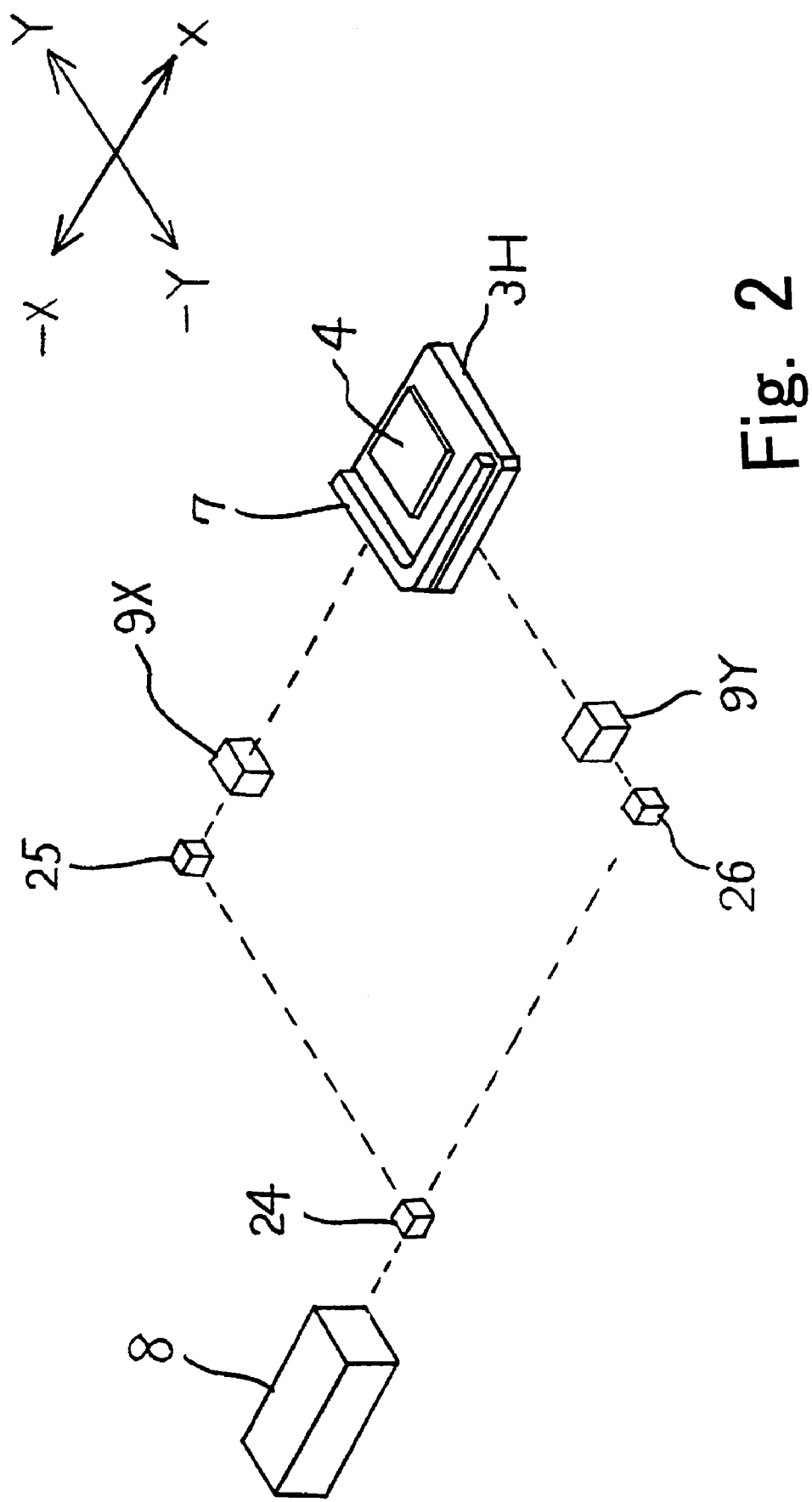
FIG. 2 is a schematic representation of a laser metrology system used in the electron beam lithographic system.
Figure 3:
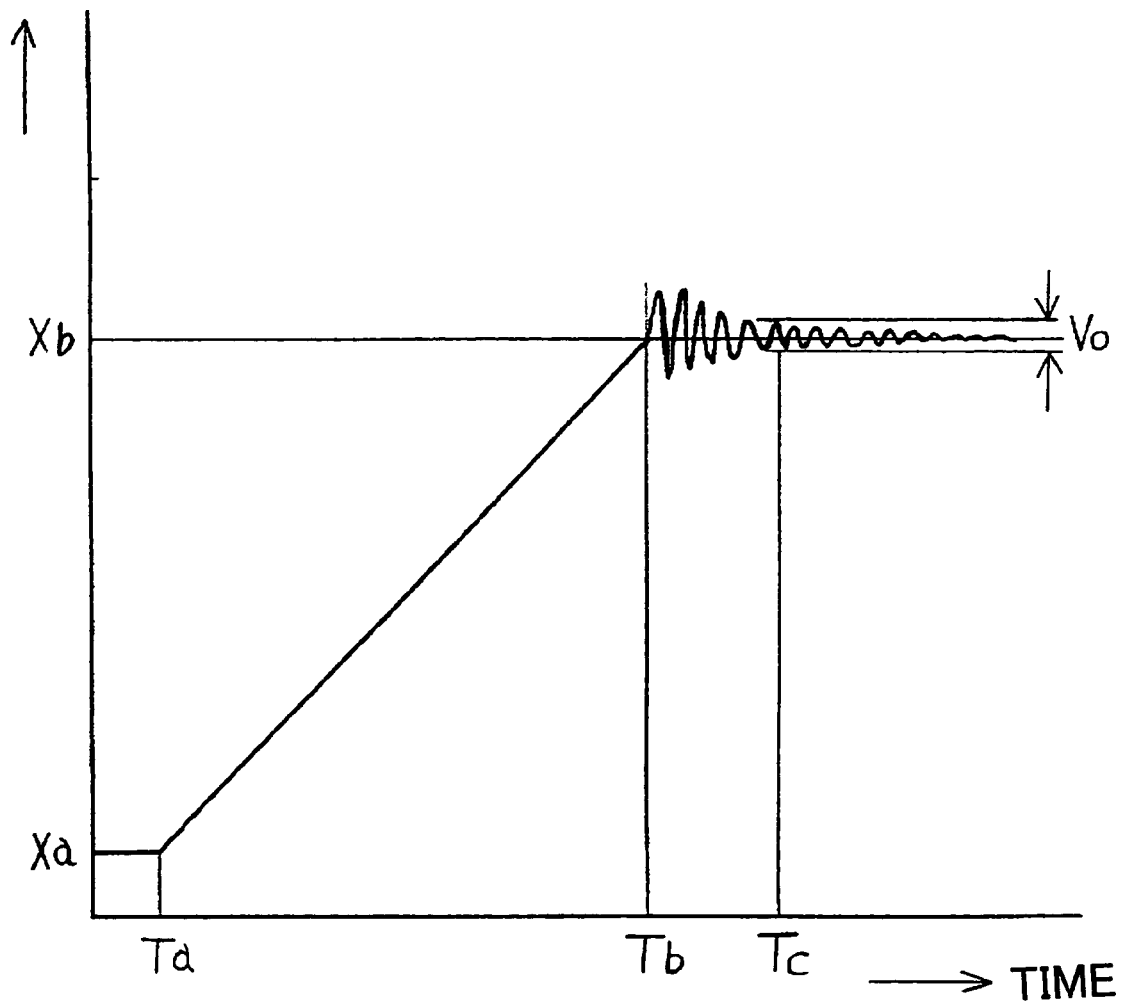
FIG. 3 is a diagram illustrating the moved position of a workpiece stage used in the electron beam lithographic system and the state of oscillation.

The system shown in FIG. 4 is similar to the system shown in FIG. 1 except that position correction signal-creating circuits 21X and 21Y for X- and Y-directions, respectively, are provided. The signal-creating circuit 21X is connected between the amplifier 17X connected to the output of the metrology control circuit 10 and the amplifier 13X connected to the X-direction deflector 5X to supply a position-correcting signal to the X-direction deflector 5X, for correcting error in the irradiation position due to the correction delay time. Similarly, the signal-creating circuit 21Y is connected between the amplifier 17Y connected to the output of the metrology control circuit 10 and the amplifier 13Y connected to the Y-direction deflector 5Y to correct error in the irradiation position.

Figure 5:
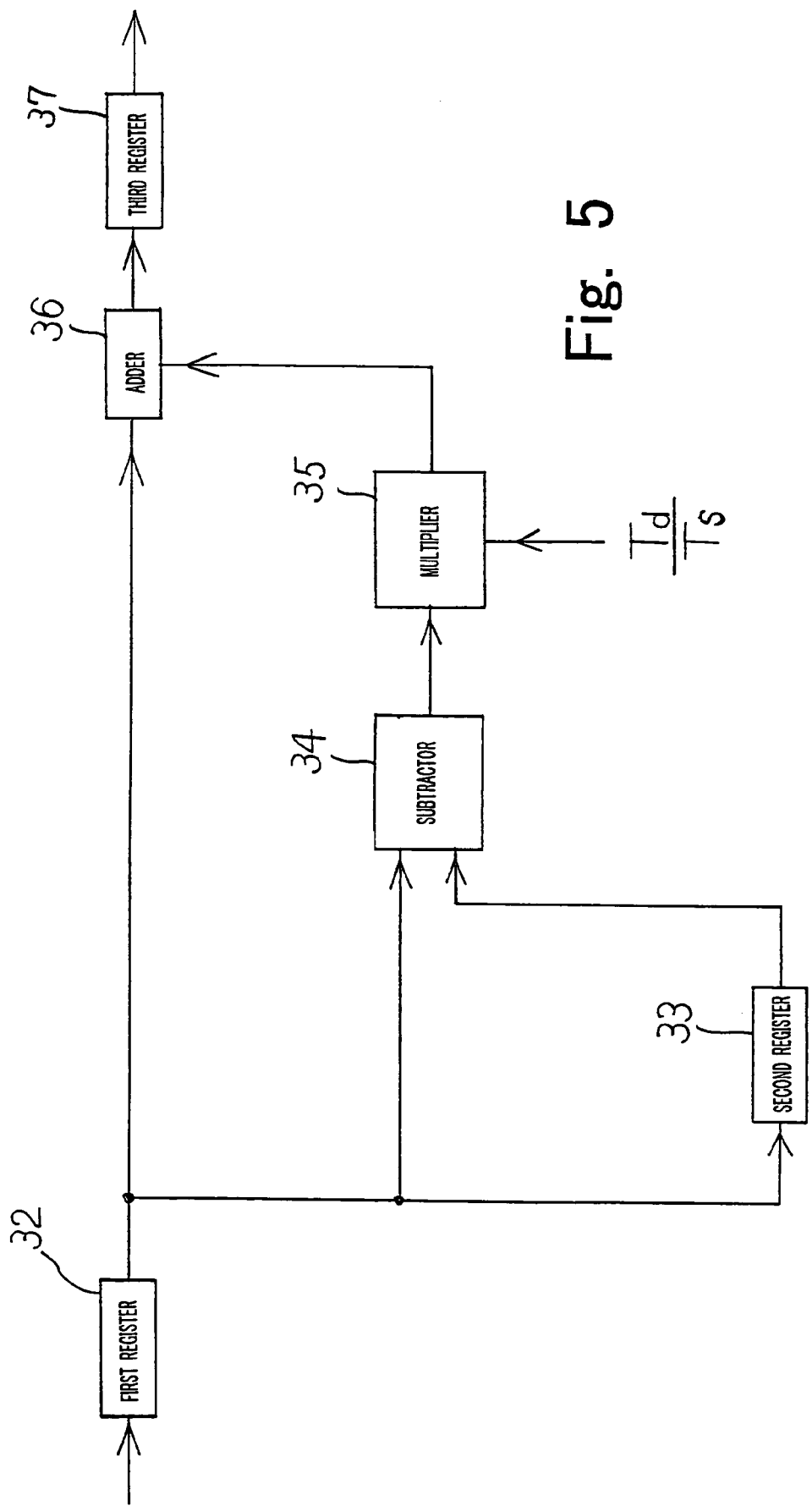
FIG. 5 is a schematic block diagram of main portions of the electron beam lithographic system shown in FIG. 4.

As shown in FIG. 5, each of the position correction signal-creating circuits 21X and 21Y is composed of a first register 32, a second register 33 for temporarily storing the output signal from the first register 32, a subtractor 34 for producing the difference between the output from the first register 32 and the output from the second register 33, a multiplier 35 for producing the product of the output from the subtractor and Td/Ts (Td is a correction delay time and Ts is a sampling time of the laser metrology system), an adder 36 for producing the sum of the output from the multiplier and the output from the first register 32, and a third register 37 for temporarily storing the output from the adder. The first register 32 temporarily stores a correction signal sent from the metrology control circuit 10 via the D/A converter 16 and amplifier 17. The correction signal corresponds to a stage stop position error signal based on the difference between the stage position signal from the interferometer 9 and the stage target position signal from the controller 11.

When the stage 3 is moved to delineate a next field of pattern, it is assumed that the stage almost at rest shifts to a state in which the amplitude of the oscillation enters the tolerable range Vo.

Let Ts be the sampling time of the laser metrology system. Let T2 be the instant of time at which the amplitude of the oscillation of the stage 3 enters the tolerable range Vo. At sampling point T1 immediately preceding the instant T2, a stage stop position error signal ΔT1 is sent from the metrology control circuit 10 to the first register 32 via the D/A converter 16 and amplifier 17 and stored in the register 32. At instant T2, a stage stop position error signal ΔT2 is sent from the metrology control circuit 10 to the first register 32 via the D/A converter 16 and amplifier 17 and stored in the register 32 instead of ΔT1. This error signal ΔT2 is also supplied to the adder 36 and subtractor 34.

The subtractor 34 calculates the difference between ΔT2 and ΔT1 and sends the difference (ΔT2−ΔT1) to the multiplier 35. The multiplier 35 calculates the product of the difference (ΔT2−ΔT1) sent in from the subtractor 34 and the ratio (Td/Ts) of the previously input, known correction delay time Td to the sampling time Ts and sends the product {(ΔT2−ΔT1)(Td/Ts)} to the adder 36. The adder calculates the sum of ΔT2 from the first register 32 and (ΔT2−ΔT1)(Td/Ts) from the adder 35 to the third register 37.

Figure 6:
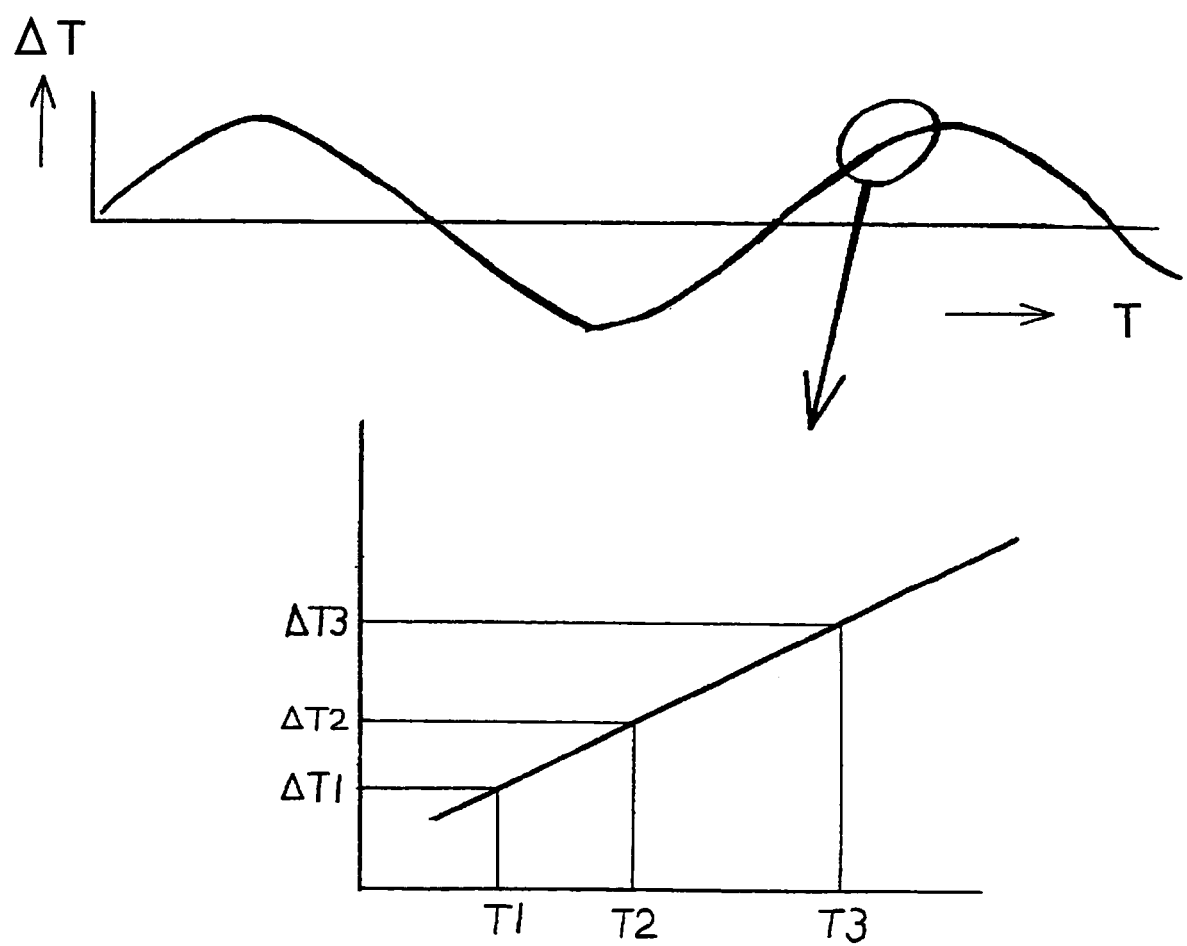
FIG. 6 is a graph in which error in a stage stop position is plotted against time in the vicinity of the stage stop position.

Since the oscillation of the stage is sufficiently slow as compared with the correction delay time, error in the stage stop position corresponding to the oscillation of the stage is approximated by a linear positional change as shown in FIG. 6. By plotting time T and stage stop position error ΔT on the horizontal and vertical axes, respectively, of FIG. 6, the linear positional change can be given as follows.

$$\Delta T = \frac{\Delta T2 - \Delta T1}{T2 - T1} \cdot T \qquad (1)$$

Therefore, a position ΔT3 taken by the stage 3 at instant T3 that passed the correction delay time Td from the instant T2 can be given by $$\begin{aligned}
\Delta T3 &= \frac{\Delta T2 - \Delta T1}{T2 - T1} \cdot T3 \qquad (2)\\
&= \frac{\Delta T2 - \Delta T1}{T2 - T1} \cdot (T2 + Td)\\
&= \frac{\Delta T2 - \Delta T1}{T2 - T1} \cdot T2 + \frac{\Delta T2 - \Delta T1}{T2 - T1} \cdot Td\\
&= \Delta T2 + (\Delta T2 - \Delta T1) \cdot \frac{Td}{T2 - T1}\\
&= \Delta T2 + (\Delta T2 - \Delta T1) \cdot \frac{Td}{Ts}
\end{aligned}$$

It can be seen from this equation that the data temporarily stored in the third register 37 corresponds to the error ΔT3 in the stop position of the stage 3 at the instant when the correction delay time Td has passed from the instant T2. The data is sent to the deflector 5X and/or deflector 5Y via the amplifier 13X and/or amplifier 13Y. As a result, the error in the stage stop position and the amount of movement of the stage produced during the correction delay time are corrected. Hence, the electron beam is made to hit the desired position on the workpiece 4 placed on the workpiece stage 3.

In the above-described embodiment, the present invention is applied to an electron beam lithographic system. The invention can also be applied to a charged-particle beam system, such as an electron beam inspection system, and to an optical beam lithographic system or optical beam inspection system using a laser beam.

Having thus described my invention in the detail and particularity required by the Patent Laws, what is desired protected by Letters Patent is set forth in the following claims.

The invention claimed is:

1. A charged-particle beam system for processing semiconductor devices and the like in which processing can begin after a step change in workpiece stage position to a new stop position without waiting until oscillation about the stop position completely ceases comprising:
    a workpiece stage on which a workpiece irradiated with a charged-particle beam is placed;
    a laser metrology system for measuring the amount of movement of the stage to a stop position; and
    first calculation means for calculating the difference between the amount of movement of the stage measured by the laser metrology system and a second stop position,
    wherein a signal corresponding to the amount calculated by said first calculation means is supplied to a beam deflection system,
    wherein there is provided second calculation means for calculating the amount of movement of the stage produced between the instant when the difference is calculated and the instant when the beam deflection system is started to be operated in response to a signal corresponding to the difference wherein said second calculation means comprises a first register for storing the difference calculated by the first calculation means, a second register which, when a new difference is placed into the first register, holds the difference stored immediately previously in the first register, a subtractor for producing the difference between an output from the first register and an output from the second register, a multiplier for producing the product of an output from the subtractor and Td/Ts, Td being a time between the instant when the difference is calculated and the instant when the beam deflection system starts to operate in response to the signal corresponding to the difference and Ts is a sampling time of the laser metrology system, an adder for producing the sum of an output from the multiplier and the output from the first register, and a third register for storing an output from the adder, and
    wherein a signal corresponding to the calculated amount of movement is supplied to the beam deflection system to compensate for the oscillation about the stop position.

2. The charged-particle beam system set forth in claim 1, wherein said laser metrology system comprises a laser light source, a reflective mirror body mounted to the stage, and a laser interferometer disposed opposite to reflective surfaces of the reflective mirror body.

* * * * *